United States Patent
Fujita

(10) Patent No.: US 10,734,241 B1
(45) Date of Patent: Aug. 4, 2020

(54) METHOD OF MANUFACTURING SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventor: Tsuyoshi Fujita, Hakusan (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/541,388

(22) Filed: Aug. 15, 2019

(30) Foreign Application Priority Data

Feb. 19, 2019 (JP) .................. 2019-027592

(51) Int. Cl.
*H01L 21/3105* (2006.01)
*H01L 21/02* (2006.01)

(52) U.S. Cl.
CPC .... *H01L 21/31056* (2013.01); *H01L 21/0217* (2013.01); *H01L 21/02129* (2013.01)

(58) Field of Classification Search
CPC ......... H01L 21/31056; H01L 21/02129; H01L 21/0217
See application file for complete search history.

(56) References Cited

U.S. PATENT DOCUMENTS

| 6,165,899 A | 12/2000 | Matumoto |
| 2003/0092277 A1* | 5/2003 | Kondo ............. H01L 21/76802 438/710 |
| 2014/0111270 A1* | 4/2014 | Lu .................. H01L 29/66333 327/432 |
| 2016/0163800 A1* | 6/2016 | Sakai ............... H01L 29/66068 257/77 |
| 2016/0260829 A1* | 9/2016 | Aichinger ......... H01L 29/7813 |

FOREIGN PATENT DOCUMENTS

| JP | 01-255225 A | 10/1989 |
| JP | 01-255255 A | 10/1989 |
| JP | 10-261624 A | 9/1998 |
| JP | 3309783 B2 | 7/2002 |

* cited by examiner

*Primary Examiner* — Duy Vu N Deo
(74) *Attorney, Agent, or Firm* — Oblon, McClelland, Maier & Neustadt, L.L.P.

(57) ABSTRACT

A semiconductor device includes a semiconductor body, and first and second electrodes provided on front and back surfaces of the semiconductor body, respectively. The semiconductor body includes a first semiconductor layer and a second semiconductor layer selectively provided between the first electrode and the first semiconductor layer. A method of manufacturing the semiconductor device includes forming a mask layer on a first insulating film provided on the front surface of the semiconductor body, the mask layer including an opening above the first semiconductor layer; selectively removing the first insulating film to expose the semiconductor body, the mask layer being entirely removed together with the first insulative film; and forming a second insulating film to contact the first insulating film and the semiconductor body. The first insulative film is selectively removed through the opening. The second insulating film is formed to be semi-insulative and contact the first semiconductor layer.

12 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from Japanese Patent Application No. 2019-027592, filed on Feb. 19, 2019; the entire contents of which are incorporated herein by reference.

FIELD

Embodiments relate to a method of manufacturing a semiconductor device.

BACKGROUND

A power control semiconductor device such as a power MOSFET (Metal Oxide Semiconductor Field Effect Transistor) or the like includes an active region serving as a current path. The active region is surrounded by a terminal region; and it is required for the power control semiconductor device to have a stable breakdown voltage in the terminal region.

DETAILED DESCRIPTION

Figure 1:
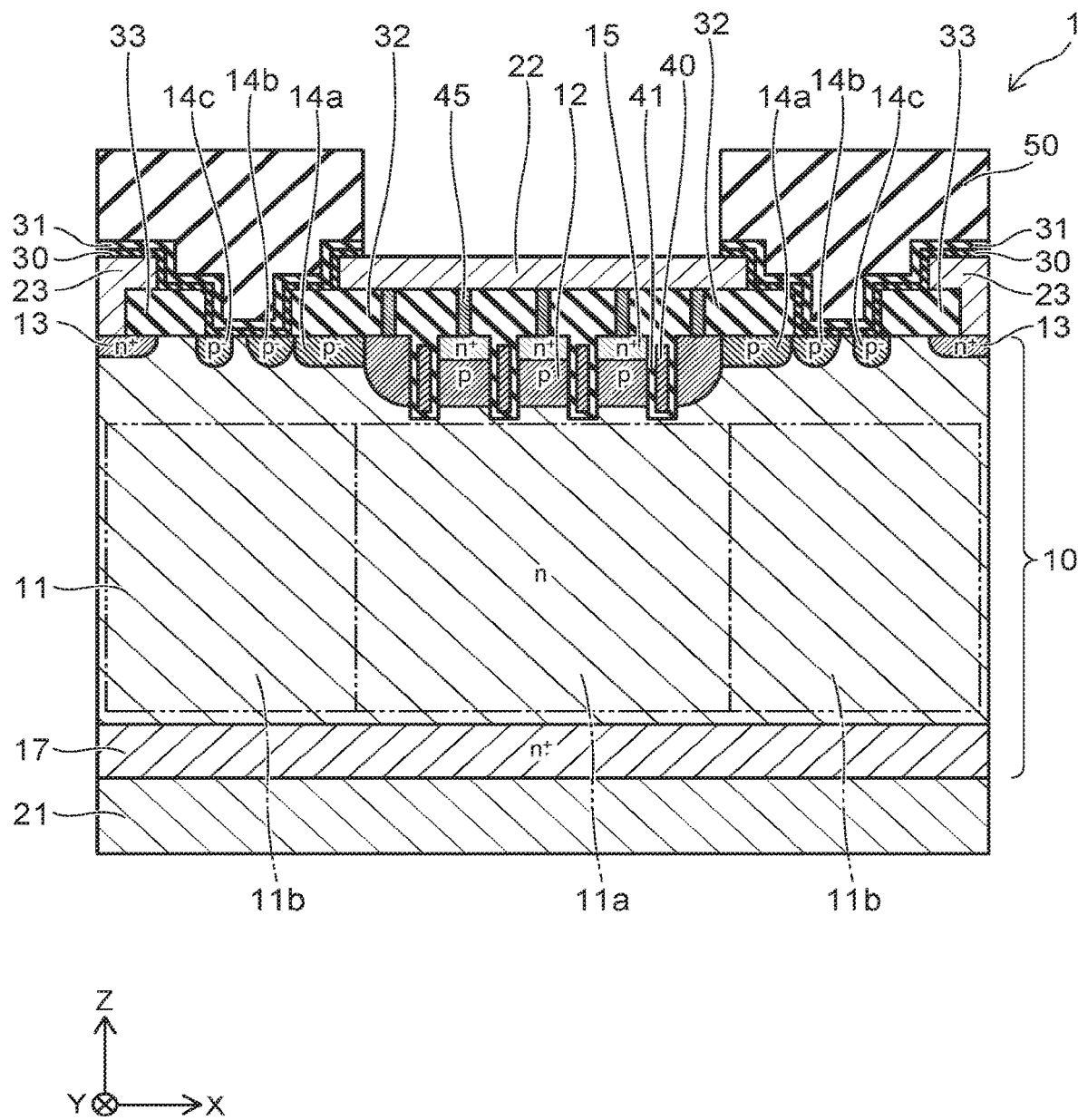
FIG. 1 is a schematic cross-sectional view showing a semiconductor device according to an embodiment.

According to one embodiment, a semiconductor device includes a semiconductor body; a first electrode provided on a front surface of the semiconductor body; and a second electrode provided on a back surface of the semiconductor body. The semiconductor body includes a first semiconductor layer of a first conductivity type and a second semiconductor layer of a second conductivity type. The second semiconductor layer is selectively provided between the first electrode and the first semiconductor layer. The first semiconductor layer surrounds the second semiconductor layer in the front surface of the semiconductor body. The method of manufacturing the semiconductor device includes forming a mask layer on a first insulating film provided on the front surface of the semiconductor body, the mask layer having an opening above the first semiconductor layer surrounding the second semiconductor layer in the front surface; selectively removing a portion of the first insulating film together with the mask layer to expose a portion of the first semiconductor layer in a space from which the portion of the first insulating film is removed, the mask layer being entirely removed while removing the portion of the first insulating film; and forming a second insulating film to contact the first insulating film and the first semiconductor layer. The second insulating film is formed to be semi-insulative.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated. The symbols "p", "p−", "n" and "n+" described in the drawings each indicate conductivity such as p-type or n-type of a portion, and a relative level of impurity concentration thereof.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a power MOSFET.

As shown in FIG. 1, the semiconductor device 1 includes a semiconductor body 10, a drain electrode 21, a source electrode 22, and an EQPR (EQuivalent-Potential Ring) electrode 23. The semiconductor body 10 is, for example, silicon.

For example, the drain electrode 21 is provided on the back surface of the semiconductor body 10. The source electrode 22 and the EQPR electrode 23 are provided selectively on the front surface of the semiconductor body 10. The EQPR electrode 23 is provided to surround the source electrode 22 along the outer edge of the semiconductor body 10. The EQPR electrode 23 is provided to be spaced from the source electrode 22 in a direction along the front surface of the semiconductor body 10.

The semiconductor body 10 includes an n-type drift layer 11 (a first semiconductor layer), a p-type base layer 12 (a second semiconductor layer), an n-type high-concentration layer 13, p-type guard ring layers 14a, 14b, and 14c, an n-type source layer 15, and an n-type drain layer 17.

The p-type base layer 12 is selectively provided between the n-type drift layer 11 and the source electrode 22. The n-type drain layer 17 is provided between the n-type drift layer 11 and the drain electrode 21. The n-type drain layer 17 includes n-type impurities with a higher concentration than the concentration of n-type impurities in the n-type drift layer 11. For example, the drain electrode 21 contacts the n-type drain layer 17 and is electrically connected to the n-type drain layer 17. The n-type drift layer 11 is electrically connected to the drain electrode 21 via the n-type drain layer 17.

The n-type high-concentration layer 13 is selectively provided between the n-type drift layer 11 and the EQPR electrode 23. The n-type high-concentration layer 13 includes n-type impurities with a higher concentration than the concentration of n-type impurities in the n-type drift layer 11. The EQPR electrode 23 contacts the n-type high-concentration layer 13 and is electrically connected to the n-type high-concentration layer 13.

The p-type guard ring layers 14a to 14c are provided to surround the p-type base layer 12 along the front surface of the semiconductor body 10. The p-type guard ring layers 14a to 14c are positioned between the p-type base layer 12 and the n-type high-concentration layer 13. The p-type guard ring layers 14a to 14c are arranged in order along the direction from the p-type base layer 12 toward the n-type high-concentration layer 13. For example, the p-type guard ring layer 14a is provided so as to contact the p-type base layer 12. The p-type guard ring layers 14a to 14c include p-type impurities with a lower concentration than the concentration of p-type impurities in the p-type base layer 12.

The n-type source layer 15 is selectively provided between the p-type base layer 12 and the source electrode 22. The n-type source layer 15 includes n-type impurities with a higher concentration than the concentration of n-type impurities in the n-type drift layer 11. The source electrode 22 is electrically connected to the n-type source layer 15.

The semiconductor device 1 further includes an insulating film 30, an insulating film 31, an insulating film 32, an insulating film 33, a gate electrode 40, and a sealing part 50. The sealing part 50 is provided to surround the source electrode 22 on the front surface of the semiconductor body 10. The sealing part 50 selectively covers the EQPR electrode 23 and the outer perimeter portion of the source electrode 22 with the insulating film 30 and the insulating film 31 interposed. The sealing part 50 is, for example, a resin such as polyimide, etc.

The insulating film 30 is provided between the semiconductor body 10 and the sealing part 50. The insulating film 30 covers the EQPR electrode 23 and the outer perimeter portion of the source electrode 22. The insulating film 30 is provided so that a portion of the insulating film 30 contacts the semiconductor body 10. The insulating film 30 is provided to contact the source electrode 22. The insulating film 30 is a semi-insulating film and includes, for example, silicon nitride. The insulating film 31 is provided between the insulating film 30 and the sealing part 50. The insulating film 31 is, for example, a silicon oxide film or a silicon nitride film. For example, the insulating film 31 serves as a protective layer protecting the semi-insulative insulating film 30. Although completely blocking the influences of the external environment such as moisture, etc., is difficult, for example, when a resin is used for the sealing part 50, it is possible to improve the blocking effect for the external environment by providing the insulating film 31. Moreover, it is also possible to block a leakage current that flows through the sealing part 50.

The insulating film 30 has electrical resistance lower than the electrical resistance of the insulating film 31. For example, the resistivity of the insulating film 30 is not less than $1.0\times10^8$ but less than $1.0\times10^{13}$ (Ω·cm). The resistivity of the insulating film 31 is $1.0\times10^{13}$ (Ω·cm) or more.

The gate electrode 40 is provided between the semiconductor body 10 and the source electrode 22. For example, the gate electrode 40 is disposed inside a gate trench provided on the front surface side of the semiconductor body 10. The gate electrode 40 is electrically insulated from the semiconductor body 10 by a gate insulating film 41. The gate electrode 40 is provided to oppose the p-type base layer 12 with the gate insulating film 41 interposed.

The insulating film 32 is provided between the semiconductor body 10 and the source electrode 22. The insulating film 32 is, for example, a silicon oxide film and electrically insulates the gate electrode 40 from the source electrode 22. The insulating film 32 is provided also between the n-type source layer 15 and the source electrode 22. The n-type source layer 15 is provided on the p-type base layer 12 between the mutually-adjacent gate electrodes 40. The source electrode 22 includes a contact portion 45 that contacts the n-type source layer 15. The contact portion 45 extends inside a contact hole provided in the insulating film 32. The source electrode 22 is electrically connected to the n-type source layer 15 via the contact portion 45.

The insulating film 33 is provided between the semiconductor body 10 and the insulating film 30. For example, the insulating film 33 covers a portion of the n-type drift layer 11 that is positioned between the p-type guard ring layer 14c and the n-type high-concentration layer 13.

The insulating film 32 further includes, for example, a portion positioned between the p-type guard ring layer 14a and the insulating film 30. The insulating film 30 contacts the semiconductor body 10 at a portion positioned between the insulating film 32 and the insulating film 33.

The semiconductor device 1 includes an active region 11a and a terminal region 11b. The active region 11a is positioned between the drain electrode 21 and the source electrode 22. The terminal region 11b surrounds the active region 11a. Here, although the active region 11a and the terminal region 11b are shown inside the n-type drift layer 11 for convenience, for example, the p-type base layer 12 and the n-type source layer 15 are positioned in the active region; and the p-type guard ring layers 14a to 14c are positioned in the terminal region. For example, when an ON-bias is supplied to the gate electrode 40, an inversion layer is induced at the interface between the p-type base layer 12 and the gate insulating film 41; and thus, an ON-current flows from the drain electrode 21 to the source electrode 22. In other words, the active region is defined as the region where the ON-current flows.

When the supply of the ON-bias to the gate electrode 40 is stopped and the semiconductor device 1 is set to the OFF-state, a high electric field is generated inside the semiconductor body 10 due to the drain voltage applied between the drain electrode 21 and the source electrode 22. In other words, a reverse bias is applied to the p-n junction between the n-type drift layer 11 and the p-type base layer 12. A depletion layer spreads inside the semiconductor body 10, and a high electric field is induced therein. The p-type guard ring layers 14a to 14c are provided to reduce the strength of the electric field induced along the outer perimeter of the p-type base layer 12. Thus, it is possible to avoid the breakdown of the p-n junction in the terminal region 11b.

However, there may be a case where, for example, the hot carriers flow into the p-type guard ring layers 14a to 14c from the n-type drift layer 11 in the terminal region 11b, and are injected into the insulating film 32. Thereby, the breakdown voltage is reduced in the terminal region. In contrast, because the semi-insulative insulating film 30 contacts the semiconductor body 10 in the semiconductor device 1, a carrier ejection path is provided, and the hot carriers can move from the n-type drift layer 11 to the source electrode 22. Thereby, it is possible to reduce the carrier injection into the insulating film 32, and to avoid the decrease of breakdown voltage in the terminal region 11b.

A method of manufacturing the semiconductor device 1 will be described here with reference to FIGS. 2A to 2D. FIGS. 2A to 2D are schematic cross-sectional views showing the processes of forming the insulating film 30 that contacts the semiconductor body 10. The p-type guard ring layers 14a to 14c are not illustrated in FIGS. 2A to 2D.

Figure 2A:
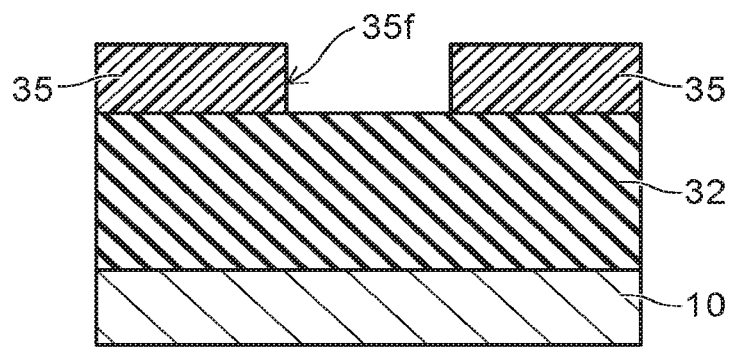
FIGS. 2A to 2D are schematic cross-sectional views showing manufacturing processes of the semiconductor device according to the embodiment.

As shown in FIG. 2A, the insulating film 32 is formed on the semiconductor body 10; and a resist mask 35 is formed on the insulating film 32. The insulating film 32 is, for example, a silicon oxide film. The resist mask 35 has an opening 35f such that a portion of the insulating film 32 is exposed at the bottom surface thereof.

Figure 2B:
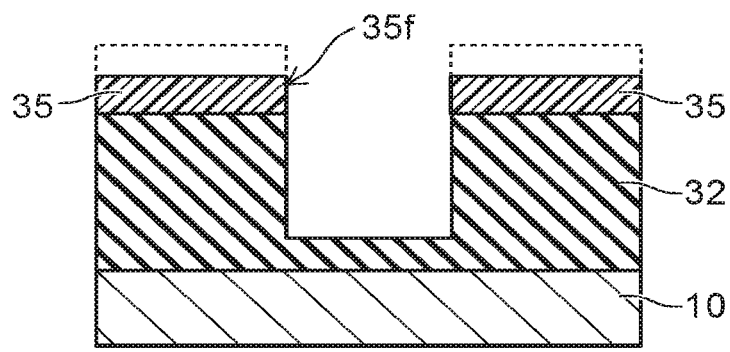

As shown in FIG. 2B, the insulating film 32 is selectively removed using the resist mask 35. For example, the insulating film 32 is selectively etched using RIE (Reactive Ion Etching). At this time, the etching of the insulating film 32 is performed under a condition such that the resist mask 35 also is etched.

For example, the resist mask 35 can be removed chemically by exposing to plasma including oxygen atoms. However, the insulating film 32 that includes, for example, silicon oxide cannot be etched by plasma including oxygen. In contrast, the insulating film 32 can be etched chemically, for example, by exposing to plasma that includes fluorine atoms. Moreover, the resist mask 35 may have resistance to plasma that includes fluorine atoms, and thus, the resist mask 35 cannot be etched chemically by plasma including fluorine atoms. In the RIE according to the embodiment, the etching is performed under the condition such that the physical etching due to the collisions of excited ions is dominant by providing the large potential difference between the discharge electrode and the wafer. Thus, both the insulating film 32 and the resist mask 35 can be etched under such a condition. For example, the RIE is performed using a kind of gas that includes fluorine atoms. Thereby, it is possible to remove the insulating film 32 by both physical etching and chemical etching.

Figure 2C:
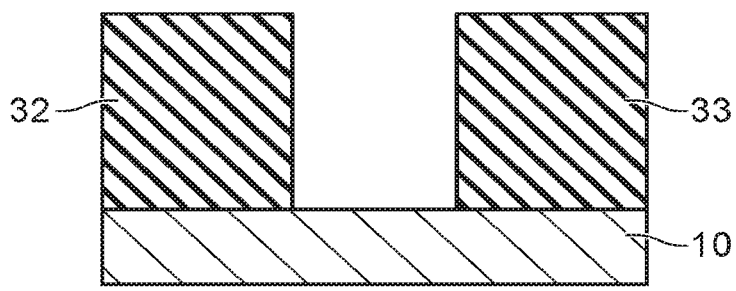

As shown in FIG. 2C, the etching of the insulating film 32 is stopped at a timing when a portion of the semiconductor body 10 is exposed and the resist mask 35 on the insulating film 32 is removed. For example, the insulating film 33 is separated from the insulating film 32 in this process.

Figure 2D:
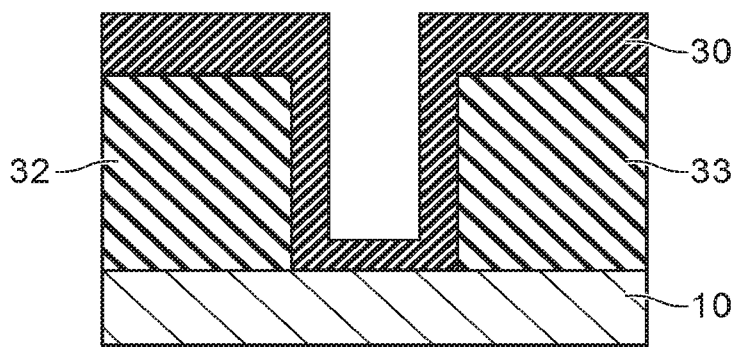

Then, as shown in FIG. 2D, the insulating film 30 is formed to cover the insulating film 32 and the insulating film 33 and to contact the exposed portion of the semiconductor body 10. For example, the insulating film 30 is formed using plasma CVD (Plasma enhanced Chemical Vapor Deposition). The insulating film 30 is a silicon nitride film. The insulating film 30 is a semi-insulating film in which the composition ratio of the silicon atoms is larger than a silicon nitride film having a composition ratio equal to the stoichiometric ratio ($Si_3N_4$).

It is desirable for the proportion Si/N of silicon atoms to nitrogen atoms in the insulating film 30 to be, for example, not less than 1.0 and not more than 1.5. For example, when a silicon nitride film is used for the insulating film 31, it is desirable for the proportion (Si/N) of the silicon atoms to be not less than 0.7 and not more than 0.95.

In the embodiment recited above, the insulating film 30 is provided to directly contact the semiconductor body 10. Thereby, the carriers can be ejected from the semiconductor body 10 via the semi-insulative insulating film 30; and it is possible to make the breakdown voltage of the p-n junction stable in the terminal region.

For example, in a manufacturing method in which the resist mask 35 is not removed when etching the insulating film 32, the insulating film 32 is selectively removed; and then, it is necessary to remove the resist mask 35 after exposing a portion of the semiconductor body 10.

The resist mask 35 may be removed, for example, using dry etching such as plasma ashing, etc., or a method of dissolving using a chemical liquid. Considering the manufacturing efficiency and the environmental impact of waste liquid processing, it is desirable to remove the resist mask 35 using dry etching. However, when the dry etching is used, for example, the exposed portion of the semiconductor body 10 is oxidized while the resist mask 35 is ashed and removed by reactive oxygen inside plasma. As a result, for example, a silicon oxide film is formed at the front surface of the semiconductor body 10. That is, a terminal structure is formed in which a silicon oxide film is interposed between the semiconductor body 10 and the insulating film 30. Thus, the carrier ejection path from the semiconductor body 10 to the source electrode 22 via the insulating film may be blocked by the silicon oxide film, making the breakdown voltage of the p-n junction degrade in the terminal region 11b.

In the manufacturing method according to the embodiment, as the resist mask 35 is removed in the etching process of the insulating film 32, the insulating film 30 can be directly formed on the semiconductor body 10. For example, when removing the insulating film 32 using RIE, the etching rate of the resist mask 35 can be increased by increasing the potential energy of the active ions inside the plasma. That is, the etching rate of the resist mask 35 can be faster under a condition in which the physical etching process due to the ion bombardment is more dominant than the etching process due to the chemical reaction. Thus, it is possible to set the etching condition, for example, so that the resist mask 35 is vanished simultaneously when the etching of the insulating film 32 is completed.

In the etching process of the insulating film 32, for example, it is preferable to monitor the signals of reaction products that include the silicon atoms of the insulating film 32 and reaction products including the carbon atoms of the resist mask 35. For example, this can be performed by spectroscopy of the plasma light emission and by monitoring the signals of the spectroscopy. For example, the end point of the etching of the insulating film 32 may be found at the timing when the light emission of reaction products including silicon reaches a minimum level or the timing when the light emission level of the reaction products including silicon starts to increase due to the effects of the silicon atoms of the semiconductor body 10. The end point of the etching of the resist mask 35 may be found at the timing when the light emission of reaction products including carbon reaches a minimum level. Thus, it is possible to stop the etching of the insulating film 32 at the timing when both end points are confirmed.

For example, when the end point of the etching of the insulating film 32 is confirmed first, the etching is stopped at the timing when the end point of the etching of the resist mask 35 is confirmed. When the end point of the etching of the resist mask 35 is confirmed first, the etching of the insulating film 32 is stopped using time control based on the etching rate thereof.

A method of manufacturing the semiconductor device 1 according to a modification of the embodiment will be described here with reference to FIGS. 3A to 3D. FIGS. 3A to 3D are schematic cross-sectional views showing the processes of forming the insulating film 30 that contacts the semiconductor body 10.

In the example, the insulating film 32 has a stacked structure including a first layer 32a, a second layer 32b, and a third layer 32c. The first layer 32a is, for example, a silicon oxide film formed by thermal oxidation of the semiconductor body 10. The second layer 32b is, for example, a silicon oxide layer formed using CVD. The third layer 32c is, for example, a BPSG layer that is a silica glass including boron (B) and phosphorus (P) and is formed using CVD.

Figure 3A:
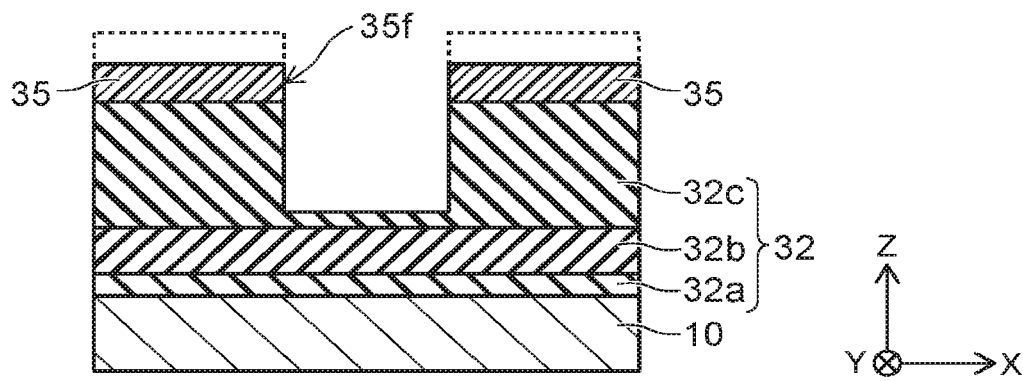
FIGS. 3A to 3D are schematic cross-sectional views showing manufacturing processes of the semiconductor device according to a variation of the embodiment.

As shown in FIG. 3A, the insulating film 32 is selectively removed using the resist mask 35. The insulating film 32 is removed under a condition in which the insulating film 32 is etched together with the resist mask 35.

Figure 3B:
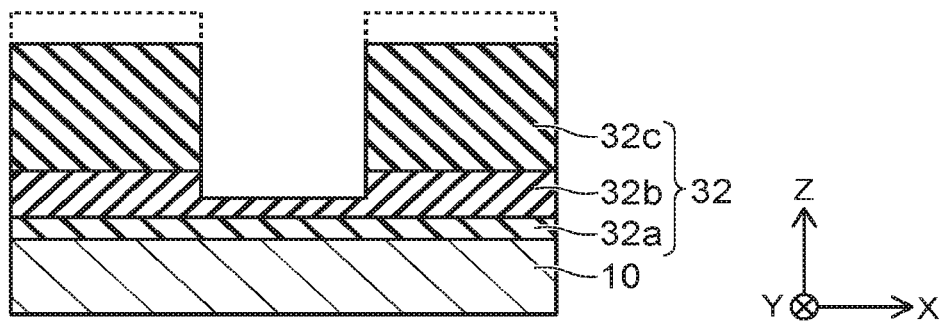

As shown in FIG. 3B, the etching of the insulating film 32 is paused at the timing when the resist mask 35 is removed.

For example, the etching condition is set to a first condition in which the etching rate of the resist mask 35 is adjusted so that the resist mask 35 is completely removed at the timing when the third layer 32c is selectively removed and the second layer 32b is exposed, or at the timing when the third layer 32c and a portion of the second layer 32b are selectively removed.

For example, the contribution ratio of the physical etching in the RIE can be changed by appropriately setting the potential difference between the discharge electrode and the wafer; and the etching rate of the resist mask 35 can be set to the preferable value. In contrast, as the chemical etching due to the chemical reaction is performed together with the physical etching in the etching process of the second layer 32b and the third layer 32c, the etching rate of the second layer 32b and the third layer 32c changes less depending on the potential difference. Accordingly, it is possible to appropriately set the etching rate of the second layer 32b, the third layer 32c, and the resist mask 35.

Figure 3C:
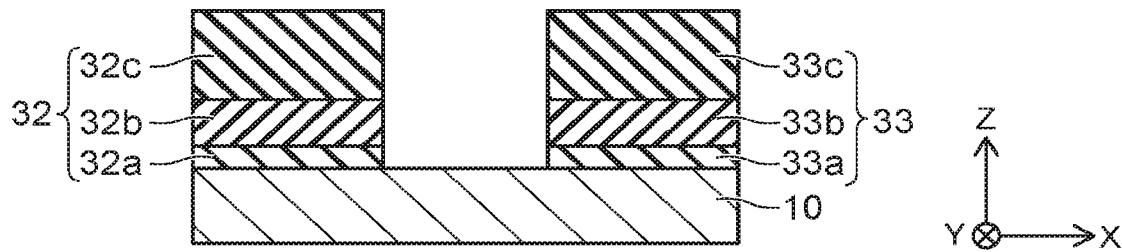

As shown in FIG. 3C, the semiconductor body 10 has a portion exposed by selectively removing a portion of the second layer 32b and a portion of the first layer 32a. At this time, the third layer 32c also is etched because the resist mask 35 does not remain on the third layer 32c. Thus, the third layer 32c is formed to have an initial film thickness such that the third layer 32c having a desired film thickness surely remains after selectively removing the second layer 32b and the first layer 32a.

For example, the etching condition of the second layer 32b and the first layer 32a is set such that when the resist mask 35 is provided, the resist mask 35 would not be etched or the etching rate of the resist mask 35 would be slower than that of the first condition.

When RIE is used, for example, the small potential difference is set between the discharge electrode and the wafer so that the physical etching is suppressed; and the etching is performed under the condition in which the chemical etching due to the excited ions is dominant (a second condition). Here, for example, a kind of gas that is used for plasma-exciting is of high reactivity to the materials of the first layer 32a and the second layer 32b, and has low or substantially no reactivity to the material of the resist mask 35. Accordingly, when the first layer 32a and the second layer 32b are chemically etched under the second condition, it is possible to suppress the physical damage in the semiconductor body 10 that serves as the foundation layer. The resist mask 35 is removed before the process shown in FIG. 3C. When a portion of the resist mask 35 remains, the etching rate of the resist mask 35 would be slower than the etching rate under the first condition, because the physical etching is suppressed when using the second condition.

The etching of the second layer 32b and the first layer 32a may be performed using CDE (Chemical Dry Etching). Thereby, while etching the second layer 32b and the first layer 32a, the physical damage may be reduced in the semiconductor body 10.

The insulating film 33 is separated from the insulating film 32 through this process. The insulating film 33 has a stacked structure including a first layer 33a, a second layer 33b, and a third layer 33c.

Figure 3D:
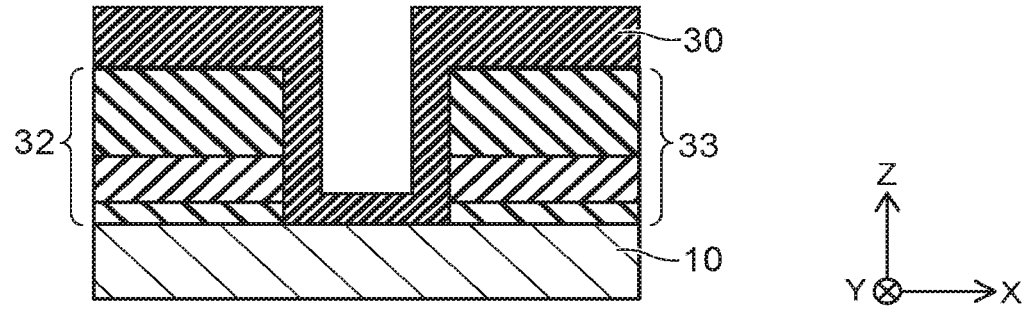

Then, as shown in FIG. 3D, the insulating film 30 is formed to cover the insulating film 32 and the insulating film 33 and directly contacts the semiconductor body 10. The insulating film 30 is formed to be a semi-insulating film.

In the manufacturing method recited above, for example, the end point of the etching is detected at the initial etching process by monitoring the light emission from the reaction products that include the carbon atoms of the resist mask 35. Also, it may be possible to monitor the light emission of the reaction products that the boron or phosphorus of the third layer 32c. That is, when the light emission of the reaction products including boron and phosphorus decreases under the minimum level thereof, the end point of removing the third layer 32c is detected. Thus, it is possible to stop the initial etching when the resist mask 35 is confirmed to be removed after the third layer 32c is removed. In contrast, the etching of the second layer 32b and the first layer 32a is stopped using time control based on the etching rate of the second layer 32b and the first layer 32a.

The manufacturing method according to the embodiment is not limited to the example recited above. For example, in the manufacturing processes shown in FIGS. 2A to 2D, the insulating film 32 may have the stacked structure including the first layer 32a, the second layer 32b, and the third layer 32c or a two-layer structure including the first layer 32a and the third layer 32c.

Figure 4:
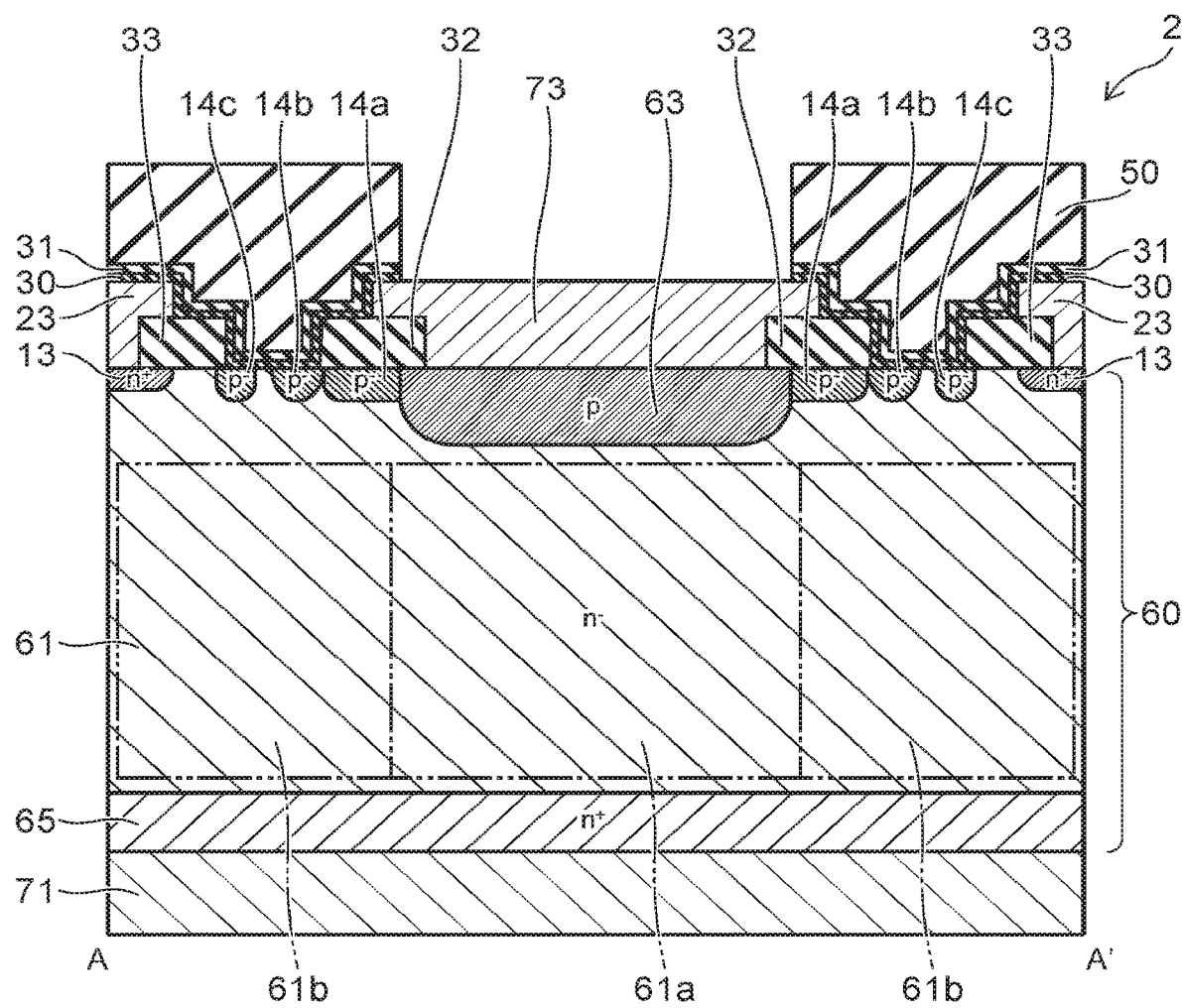
FIG. 4 is a schematic cross-sectional view showing a semiconductor device according to a variation of the embodiment.

FIG. 4 is a schematic cross-sectional view showing a semiconductor device 2 according to a modification of the embodiment. The semiconductor device 2 is, for example, a PIN diode.

The semiconductor device 2 includes a semiconductor body 60, a cathode electrode 71, and an anode electrode 73. The cathode electrode 71 is provided on the back surface of the semiconductor body 60. The anode electrode 73 is provided on the front surface of the semiconductor body 60.

As shown in FIG. 4, the semiconductor body 60 includes a low-concentration n-type semiconductor layer (hereinbelow, an I-layer 61), a p-type anode layer 63, and an n-type cathode layer 65. The p-type anode layer 63 is provided between the I-layer 61 and the anode electrode 73. The anode electrode 73 contacts the p-type anode layer 63 and is electrically connected to the p-type anode layer 63. The n-type cathode layer 65 is provided between the I-layer 61 and the cathode electrode 71. The n-type cathode layer 65 includes n-type impurities with a higher concentration than the concentration of n-type impurities in the I-layer 61. The cathode electrode 71 contacts the n-type cathode layer 65 and is electrically connected to the n-type cathode layer 65.

The semiconductor device 2 includes an active region 61a a terminal region 61b. The active region 61a is positioned between the cathode electrode 71 and the anode electrode 73. The terminal region 61b is positioned around the active region 61a. The p-type anode layer 63 is provided in the active region. Here as well, the active region 61a and the terminal region 61b of the I-layer 61 are shown for convenience, and the p-type anode layer 63 is positioned in the active region.

The semiconductor body 60 further includes the p-type guard ring layers 14a to 14c and the n-type high-concentration layer 13. The p-type guard ring layers 14a to 14c are provided to surround the p-type anode layer 63 along the front surface of the semiconductor body 60. The n-type high-concentration layer 13 is provided to surround the p-type anode layer 63 along the outer edge of the semiconductor body 60 on the front surface side. The p-type guard ring layers 14a to 14c are provided between the p-type anode layer 63 and the n-type high-concentration layer 13. The n-type high-concentration layer 13 includes n-type impurities with a higher concentration than the concentration of n-type impurities in the I-layer 61. The semiconductor device 2 further includes the EPQR electrode 23, the insulating film 30, the insulating film 31, the insulating film 32, the insulating film 33 and the sealing part 50. The EPQR electrode 23 is provided above the n-type high-concentration layer 13. The EPQR electrode 23 contacts the n-type high-concentration layer 13 and is electrically connected to the n-type high-concentration layer 13. The sealing part 50 is provided to surround the anode electrode 73 on the front surface side of the semiconductor body 60. The sealing part 50 covers the EQPR electrode 23 and the outer perimeter portion of the anode electrode 73.

The insulating film 30 is provided between the semiconductor body 60 and the sealing part 50. The insulating film 30 covers the EQPR electrode 23 and the outer perimeter portion of the anode electrode 73. The insulating film 30 is provided to have a portion that contacts the semiconductor body 60. The insulating film 30 is provided also to contact the anode electrode 73. The insulating film 30 is a semi-insulating film and includes, for example, silicon nitride.

The insulating film 31 is provided between the insulating film 30 and the sealing part 50. The insulating film 31 is, for example, a silicon oxide film or a silicon nitride film. For example, the insulating film 31 serves as a protective layer which protects the semi-insulative insulating film 30.

The insulating film 32 is provided between the p-type guard ring layer 14a and the insulating film 30. The insulating film 32 is, for example, a silicon oxide film. The insulating film 33, for example, is provided between the semiconductor body 60 and the insulating film 30 to cover a portion of the I-layer 61 that is positioned between the p-type guard ring layer 14c and the n-type high-concentration layer 13. The insulating film 30 contacts the semiconductor body 10 at a portion positioned between the insulating film 32 and the insulating film 33.

In the semiconductor device 2 as well, the insulating film 30 is formed by the manufacturing method shown in FIGS. 2A to 2D or FIGS. 3A to 3D. Thereby, the insulating film 30 directly contacts the semiconductor body 60; and thus, it is possible to prevent the p-n junction in the terminal region 61b from the breakdown at the lower voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, the semiconductor device comprising:
   a semiconductor body including a first semiconductor layer of a first conductivity type;
   a first electrode provided on a front surface of the semiconductor body; and
   a second electrode provided on a back surface of the semiconductor body,
   the semiconductor body further including a second semiconductor layer of a second conductivity type selectively provided between the first electrode and the first semiconductor layer, the first semiconductor layer surrounding the second semiconductor layer in the front surface of the semiconductor body,
   the method comprising:
   forming a mask layer on a first insulating film provided on the front surface of the semiconductor body, the mask layer having an opening above the first semiconductor layer surrounding the second semiconductor layer in the front surface;
   selectively removing a portion of the first insulating film together with the mask layer to expose a portion of the first semiconductor layer in a space from which the portion of the first insulating film is removed, the mask layer being entirely removed while removing the portion of the first insulating film; and
   forming a second insulating film to contact the first insulating film and the first semiconductor layer, the second insulating film being formed to be semi-insulative.

2. The method according to claim 1, wherein the portion of the first semiconductor layer is exposed after the mask layer is entirely removed.

3. The method according to claim 2, wherein
   the portion of the first insulating film is removed using dry etching, and
   the portion of the first semiconductor layer is exposed through a first step and a second step,
   the first portion of the first insulating film being selectively removed together with the mask layer in the first step, the mask layer being entirely removed through the first step,
   an entire surface of the first insulating film being etched in the second step,
   the mask layer and the first insulating film being etched under a first condition of the dry etching in the first step,
   the first insulating film being etched under a second condition of the dry etching in the second step,
   the dry etching includes physical etching and chemical etching, the physical etching being simultaneously performed with the chemical etching, a contribution ratio of the physical etching being suppressed in the second condition comparing to the first condition.

4. The method according to claim 3, wherein the dry etching is performed while monitoring a signal of a reaction product including a major component of the mask layer and a signal of a reaction product including a major component of the first insulating film.

5. The method according to claim 1, wherein the second insulating film includes silicon nitride.

6. The method according to claim 5, wherein the second insulative film is formed to have a non-stoichiometric composition having a silicon atom ratio larger than the silicon atom ratio of the stoichiometric composition.

7. The method according to claim 1, wherein the first insulative film has a stacked structure including a first layer, a second layer and a third layer, the first and second layers being positioned between the third layer and the semiconductor body, the second layer being positioned between the first layer and the third layer, and
   the mask layer is entirely removed while the second layer and the third layer are selectively removed.

8. The method according to claim 7, wherein the third layer is a silica glass layer including boron atoms and phosphorus atoms.

9. The method according to claim 8, wherein
   the mask layer includes carbon atoms, and
   the dry etching is performed while monitoring a signal of a reaction product including a carbon atom of the mask layer and a signal of a reaction product including boron and phosphorus atoms of the third layer.

10. The method according to claim 9, wherein
    the portion of the first insulating film is removed through a first step and a second step, the second and third layers of the first insulating film being selectively removed in the first step, the mask layer being entirely removed through the first step, the first layer of the first insulating film being selectively removed using the third layer as an etching mask in the second step.

11. The method according to claim 9, wherein the end of the first step is detected based on the signal of the reaction product including a carbon atom of the mask layer.

12. The method according to claim 9, wherein the end of removing the third layer of the first insulative film is detected based on the signal of the reaction product including boron and phosphorus atoms of the third layer.

* * * * *